(12) United States Patent
Zhang et al.

(10) Patent No.: US 9,978,760 B2
(45) Date of Patent: May 22, 2018

(54) SEMICONDUCTOR DEVICE AND RELATED MANUFACTURING METHOD

(71) Applicants: Semiconductor Manufacturing International (Beijing) Corporation, Beijing (CN); Semiconductor Manufacturing International (Shanghai) Corporation, Shanghai (CN)

(72) Inventors: Yiying Zhang, Shanghai (CN); Erhu Zheng, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days. days.

(21) Appl. No.: 15/298,578

(22) Filed: Oct. 20, 2016

(65) Prior Publication Data

US 2017/0179142 A1 Jun. 22, 2017

(30) Foreign Application Priority Data

Dec. 22, 2015 (CN) .......................... 2015 1 0968184

(51) Int. Cl.
*H01L 27/115* (2017.01)
*H01L 29/66* (2006.01)
(Continued)

(52) U.S. Cl.
CPC .. *H01L 27/11524* (2013.01); *H01L 21/28273* (2013.01); *H01L 21/3065* (2013.01);
(Continued)

(58) Field of Classification Search
CPC .............. H01L 29/792; H01L 29/4234; H01L 29/42324; H01L 29/42344; H01L 29/519;
(Continued)

(56) References Cited

U.S. PATENT DOCUMENTS

2009/0108415 A1* 4/2009 Lenski ................ H01L 29/6653
257/649
2011/0006355 A1* 1/2011 Shen ................. H01L 27/11521
257/316

(Continued)

FOREIGN PATENT DOCUMENTS

JP 2006324274 11/2006

OTHER PUBLICATIONS

EP Search Report corresponding to European Patent Application No. 16204233.7, dated May 2, 2017, 10 pages.

*Primary Examiner* — Cheung Lee
*Assistant Examiner* — Stephen C Smith
(74) *Attorney, Agent, or Firm* — Innovation Counsel LLP

(57) ABSTRACT

A method for manufacturing a semiconductor device may include the following steps: providing a spacer structure on a first side of a stack structure, wherein the stack structure includes a mask and a conductor; providing an etch stop layer, wherein a portion of the etch stop layer directly contacts both the mask and a portion of the spacer structure; providing a dielectric material member on the etch stop layer; partially removing the first dielectric material member to expose the portion of the etch stop layer; removing the portion of the etch stop layer to expose the portion of the spacer structure; removing the portion of the spacer structure to expose a side of the mask and to form a first spacer; and providing a second spacer, which directly contacts both the first spacer and the side of the mask.

20 Claims, 9 Drawing Sheets

(51) Int. Cl.
  *H01L 21/308* (2006.01)
  *H01L 21/28* (2006.01)
  *H01L 29/788* (2006.01)
  *H01L 21/3065* (2006.01)
  *H01L 27/11524* (2017.01)
  *H01L 27/11521* (2017.01)

(52) U.S. Cl.
  CPC .... *H01L 21/3085* (2013.01); *H01L 27/11521* (2013.01); *H01L 29/66553* (2013.01); *H01L 29/66825* (2013.01); *H01L 29/7889* (2013.01)

(58) Field of Classification Search
  CPC ......... H01L 29/66553; H01L 29/66562; H01L 21/32; H01L 21/31055; H01L 21/32139; H01L 21/76874; H01L 29/66825; H01L 29/7889; H01L 21/3985; H01L 27/11524; H01L 27/11521
  See application file for complete search history.

(56) References Cited

U.S. PATENT DOCUMENTS

2014/0319594 A1  10/2014  Matsuda
2015/0270273 A1   9/2015  Ma et al.

* cited by examiner

SEMICONDUCTOR DEVICE AND RELATED MANUFACTURING METHOD

CROSS-REFERENCE TO RELATED APPLICATION

This application claims priority to and benefit of Chinese Patent Application No. 201510968184.5, filed on 22 Dec. 2015; the Chinese Patent Application is incorporated herein by reference in its entirety.

BACKGROUND

The technical field is related to a semiconductor device (such as a flash memory device) and a method for manufacturing the semiconductor device.

A threshold voltage of a semiconductor device, such as a flash memory device, may significantly affect performance of the semiconductor device. In general, a substantially stable threshold voltage should be desirable. Nevertheless, in a miniaturized semiconductor device, conductive components may not remain sufficiently separated from each other, such that a threshold voltage of the miniaturized semiconductor device may not remain in a desirable range after substantial use of the semiconductor device. As a result, performance of the semiconductor device may deteriorate.

SUMMARY

An embodiment may be related to a method for manufacturing a semiconductor device. The method may include preparing a substrate, a dielectric material layer, and a stack structure. The dielectric material layer may be positioned between the substrate and the stack structure. The stack structure may include a first conductor, an insulator, a second conductor, and a mask. The first conductor, the insulator, and the second conductor may be positioned between the dielectric material layer and the mask.

The method may further include providing a spacer structure on a first side of the stack structure. The first side of the stack structure may not be parallel to a bottom side of the substrate.

The method may further include providing an etch stop layer. A first portion of the etch stop layer may directly contact both the mask and a first portion of the spacer structure.

The method may further include providing a first dielectric material member on the etch stop layer. A material of the first dielectric material member may be different from a material of the etch stop layer.

The method may further include partially removing the first dielectric material member to form a first dielectric member and to expose the first portion of the etch stop layer.

The method may further include removing the first portion of the etch stop layer to form an etch stop material layer and to expose the first portion of the spacer structure.

The method may further include removing the first portion of the spacer structure to form a first spacer and to expose a first side of the mask.

The method may further include providing a spacer material member. The spacer material member may directly contact both the first spacer and the first side of the mask. A material of the spacer material member may be different from a material of the first dielectric member. The spacer material member may directly contact the etch stop material layer.

The method may include the following steps: removing the first portion of the etch stop layer using a first dry etching process; and removing the first portion of the spacer structure using a second dry etching process.

The method may include the following steps: removing the first dielectric member to expose the etch stop material layer; partially removing the etch stop material layer to form an etch stop material member, which may directly contact the first spacer; and partially removing the dielectric material layer to form a dielectric layer and to form a hole that exposes the substrate.

The method may include partially removing the spacer material member to form a second spacer in a process of at performing least one of exposing the etch stop material layer, forming the etch stop material member, and forming the hole.

The method may include the following steps: providing a second dielectric material member on the first dielectric member, the spacer material member, and the mask; partially removing the second dielectric material member using a planarization process to form a second dielectric member; and removing the second dielectric member and the first dielectric member to expose the etch stop material layer. The method may include partially removing the spacer material member to form a second spacer in a process of performing at least one of exposing the etch stop material layer, forming the etch stop material member, and forming the hole.

The method may include providing a conductive member in the hole. The conductive member may directly contact each of the substrate, the dielectric layer, the etch stop material member, and the second spacer.

The first spacer may include a first silicon oxide layer and a silicon nitride layer. The first silicon oxide layer may be positioned between the silicon nitride layer and the insulator and may directly contact each of the silicon nitride layer and the insulator. The silicon nitride layer may be positioned between the first silicon oxide layer and the etch stop material layer. The spacer material member may directly contact each of the first silicon oxide layer and the silicon nitride layer. A portion of the first silicon oxide layer may be positioned between the silicon nitride layer and the dielectric material layer and may directly contact each of the silicon nitride layer, the dielectric material layer, and the etch stop material layer.

The first spacer may include a second silicon oxide layer. The second silicon oxide layer may be positioned between the silicon nitride layer and the etch stop material layer and may directly contact each of the silicon nitride layer and the etch stop material layer. The silicon nitride layer may be positioned between the first silicon oxide layer and the second silicon oxide layer. The spacer material member may directly contact the second silicon oxide layer. A portion of the silicon nitride layer may be positioned between the second silicon oxide layer and the dielectric material layer and may directly contact the etch stop material layer.

A difference between a height of the mask and a height of the first dielectric member may be in a range of 40% of a thickness of the mask and 85% of the thickness of the mask. The height of the mask and the height of the first dielectric member may be with reference to the bottom side of the substrate. The thickness of the mask may be in a direction perpendicular to the bottom side of the substrate.

The etch stop layer may be formed of at least one of silicon nitride material, a metal material, and a high-k dielectric material.

An embodiment may be related to a semiconductor device. The semiconductor device may include the following elements: a substrate; a stack structure, which may include a first conductor, an insulator, a second conductor, and a mask, wherein the insulator and the second conductor may be positioned between the first conductor and the mask; a dielectric layer positioned between the substrate and the stack structure; a first spacer, which may directly contact the dielectric layer and may directly contact a first portion of a first side of the stack structure; a second spacer, which may directly contact the first spacer and may directly contact a second portion of the first side of the stack structure, wherein the first spacer may be positioned between the second spacer and the dielectric layer; and an etch stop material member, which may directly contact the dielectric layer, the first spacer, and the second spacer and may be positioned between the dielectric layer and the second spacer. A material of the etch stop material member may be different from a material of the second spacer.

The first spacer may directly contact each of the first conductor, the insulator, the second conductor, and the mask. The second spacer may directly contact the mask.

The semiconductor device may include a conductive member, which may directly contact each of the second spacer, the etch stop material member, the dielectric layer, and the substrate.

The etch stop material member may be formed of at least one of silicon nitride material, a metal material, and a high-k dielectric material.

The first spacer may include a first silicon oxide layer and a silicon nitride layer. The first silicon oxide layer may be positioned between the silicon nitride layer and the insulator and may directly contact each of the silicon nitride layer and the insulator. The silicon nitride layer may be positioned between the first silicon oxide layer and the etch stop material layer. The spacer material member may directly contact each of the first silicon oxide layer and the silicon nitride layer. A portion of the first silicon oxide layer may be positioned between the silicon nitride layer and the dielectric material layer and may directly contact each of the silicon nitride layer, the dielectric material layer, and the etch stop material layer.

The first spacer may include a second silicon oxide layer. The second silicon oxide layer may be positioned between the silicon nitride layer and the etch stop material layer and may directly contact each of the silicon nitride layer and the etch stop material layer. The silicon nitride layer may be positioned between the first silicon oxide layer and the second silicon oxide layer. The spacer material member may directly contact the second silicon oxide layer. A portion of the silicon nitride layer may be positioned between the second silicon oxide layer and the dielectric material layer and may directly contact the etch stop material layer.

According to embodiments, in manufacturing of a semiconductor device, such as a flash memory device (e.g., a NOR flash), spacers provided on a gate structure may be sufficiently protected without being significantly damaged. Therefore, the gate structure may be desirably spaced from other elements of the semiconductor device, such that a threshold voltage of the semiconductor may remain sufficiently stable. Advantageously, satisfactory performance of the semiconductor device may be substantially maintained.

The above summary is related to some of many embodiments disclosed herein and is not intended to limit the scope of embodiments.

BRIEF DESCRIPTION OF THE DRAWINGS

FIG. 14 shows a schematic diagram (e.g., a schematic cross-sectional view) that illustrates elements and/or structures in a semiconductor device in accordance with one or more embodiments.

DETAILED DESCRIPTION

Figure 1:
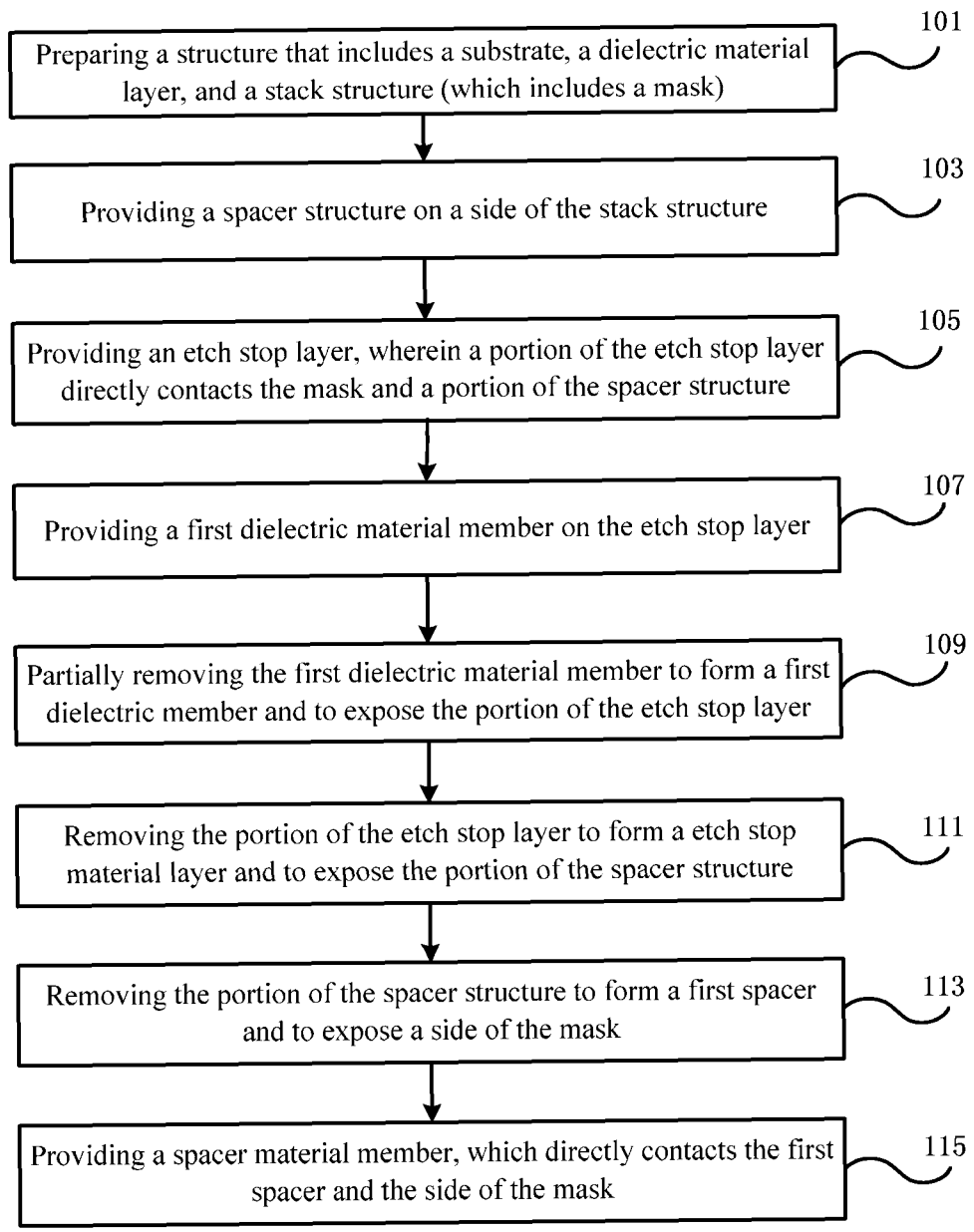
FIG. 1 shows a flowchart that illustrates steps in a method for manufacturing one or more semiconductor devices in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductive" may mean "electrically conductive". The term "insulating" may mean "electrically insulating". The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, optomagnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a flowchart that illustrates steps in a method for manufacturing one or more semiconductor devices in accordance with one or more embodiments. FIG. 2, FIG. 3A, FIG. 3B, FIG. 4, FIG. 5, FIG. 6, FIG. 7, FIG. 8, FIG. 9, FIG. 10, FIG. 11A, FIG. 11B, FIG. 12, FIG. 13, and FIG. 14 show schematic diagrams (e.g., schematic cross-sectional views) that illustrate elements and/or structures formed in the method for manufacturing one or more semiconductor devices in accordance with one or more embodiments. The method may include steps 101, 103, 105, 107, 109, 111, 113, and 115.

Figure 2:
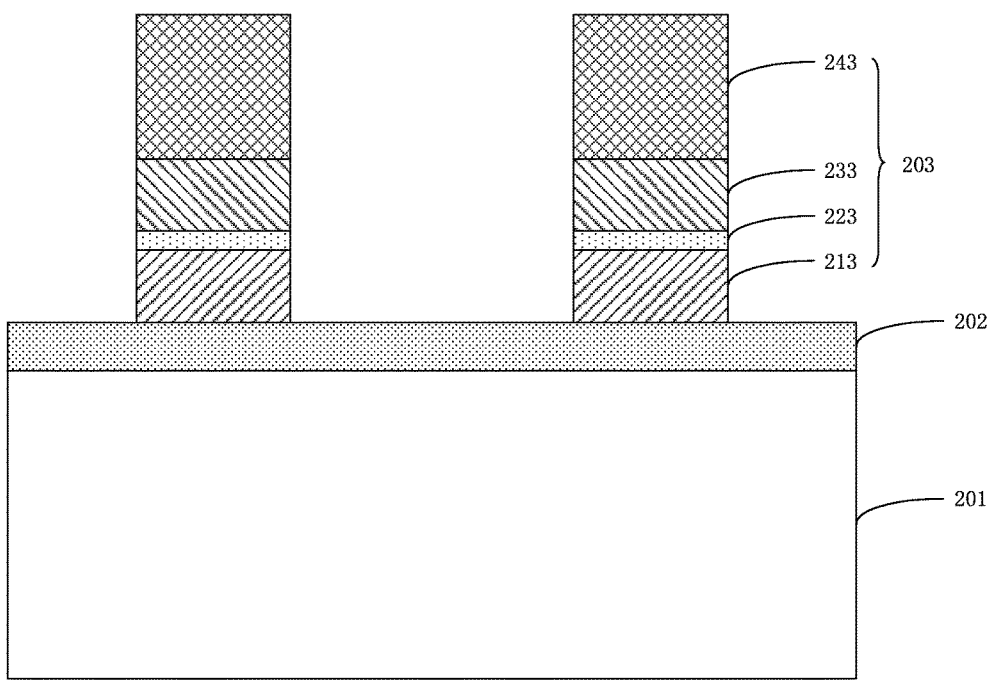
FIG. 2, FIG. 3A, FIG. 3B, FIG. 4, FIG. 5, FIG. 6, FIG. 7, FIG. 8, FIG. 9, FIG. 10, FIG. 11A, FIG. 11B, FIG. 12, FIG. 13, and FIG. 14 show schematic diagrams (e.g., schematic cross-sectional views) that illustrate elements and/or structures formed in a method for manufacturing one or more semiconductor devices in accordance with one or more embodiments.

Referring to FIG. 1 and FIG. 2, the step 101 may include preparing a substrate 201, a dielectric material layer 202, and stack structures including a stack structure 203. The dielectric material layer 202 may be positioned between the substrate 201 and the stack structure 203.

The stack structure 203 may include a conductor 213, an insulator 223, a conductor 233, and a mask 243. The conductor 213, the insulator 223, and the conductor 233 may be positioned between the dielectric material layer 202 and the mask 243. The conductor 213 may function as a floating gate electrode of a semiconductor device, such as memory device (e.g., a NOR flash memory device). The conductor 233 may function as a control gate electrode of the semiconductor device. The insulator 223 may be formed of a dielectric material. Other stack structures may be identical to or analogous to the stack structure 203. Subsequent process steps associated with the other stack structures may be identical to or analogous to subsequent process steps associated with the stack structure 203.

A portion of the dielectric material layer 202 that directly contacts the stack structure 203 and is positioned immediately under the stack structure may be a tunneling dielectric layer portion, such as a tunneling oxide layer portion. In the semiconductor device, carriers (e.g., electrons) may tunnel through the tunneling dielectric layer portion to enter the conductor 213 (a floating gate electrode), and/or carriers (e.g., electrons) from the conductor 213 may tunnel through the tunneling dielectric layer portion. Portions of the dielectric material layer 202 that are positioned between stack structures may be optional or unnecessary.

The step 101 may include the following steps: preparing the substrate 201, which may be a semiconductor substrate, such as a silicon substrate; sequentially forming the dielectric material layer 202, a first conductive material layer (e.g., a polycrystalline silicon layer), an insulating material layer (e.g., a composite layer including two silicon oxide material layers and a silicon material layer positioned in the silicon oxide layers), a second conductive material layer (e.g., a polycrystalline silicon layer), and a mask material layer (e.g., a silicon nitride material layer); providing a patterned photoresist on the mask material layer; etching the mask material layer, the second conductive material layer, the insulating material layer, the first conductive material layer through the patterned photoresist to form the stack structures and to expose the dielectric material layer 202; and removing the patterned photoresist.

Referring to FIG. 1, FIG. 2, and FIG. 3A or FIG. 3B, subsequent to the step 101, the step 103 may include providing a spacer structure 3011 on a first side of the stack structure 203. The first side of the stack structure 203 may not be parallel to a bottom side of the substrate 201.

Figure 3A:
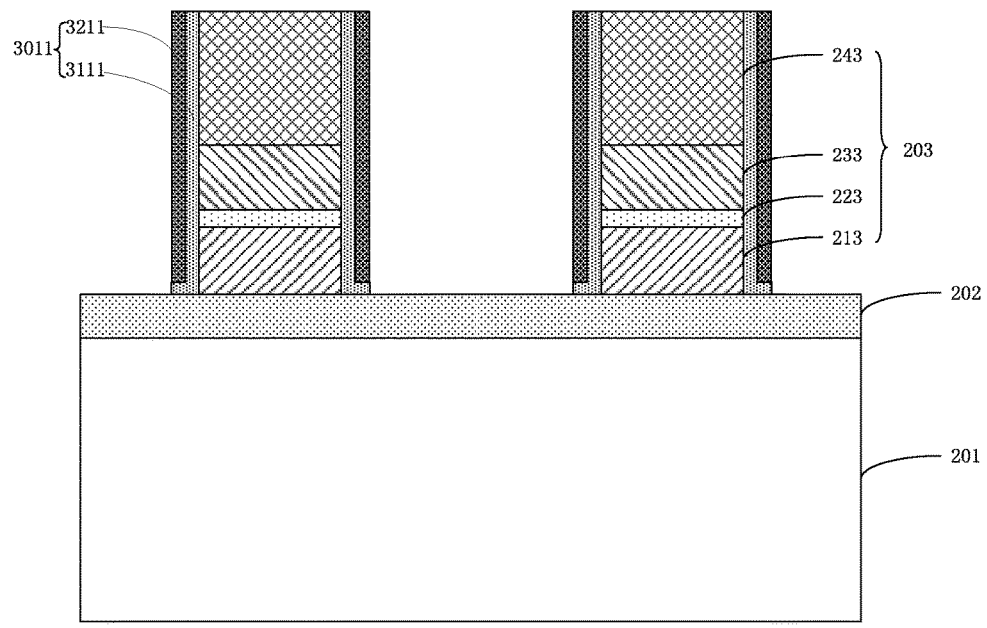
Figure 3B:
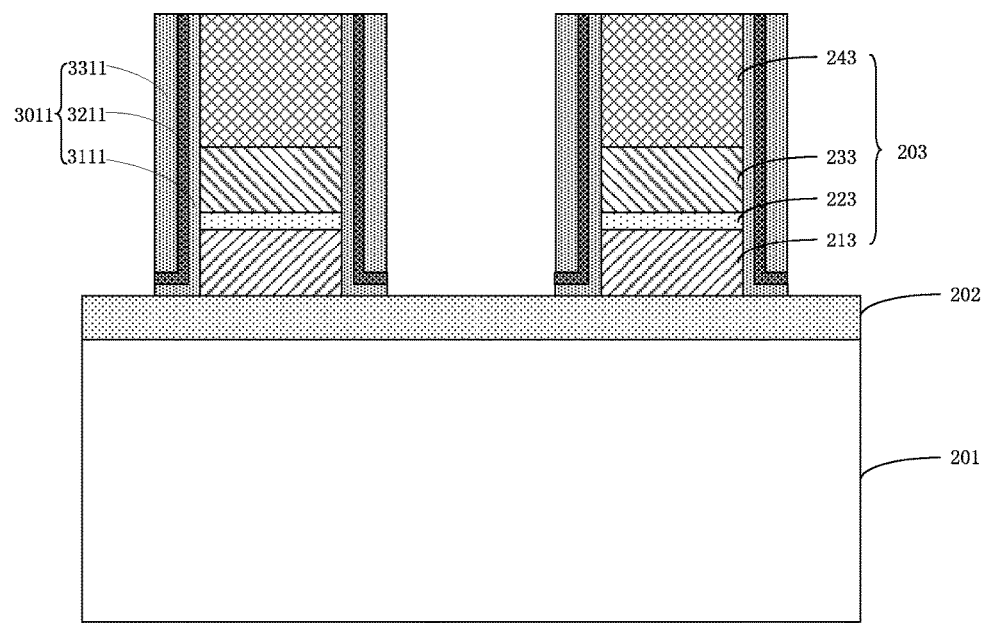

Referring to FIG. 3A and FIG. 3B, the spacer structure 3011 may include multiple layers formed of different materials. In one or more embodiments, the spacer structure 3011 may include a silicon oxide layer 3111 and a silicon nitride layer 3211. The silicon oxide layer 3111 may be positioned between the silicon nitride layer 3211 and the insulator 223 and may directly contact each of the silicon nitride layer 321 and the insulator 223. A portion of the silicon oxide layer 3111 may be positioned between the silicon nitride layer 3211 and the dielectric material layer 202 and may directly contact each of the silicon nitride layer 321 and the dielectric material layer 202.

Referring to FIG. 3B, the spacer structure 3011 may include a silicon oxide layer 3311. The silicon nitride layer 3211 may be positioned between the silicon oxide layer 3111 and the silicon oxide layer 3311. A portion of the silicon nitride layer 3211 may be positioned between the silicon oxide layer 3311 and the dielectric material layer 202.

Referring to FIG. 1, FIG. 3A or FIG. 3B, and FIG. 4, subsequent to the step 103, the step 105 may include providing an etch stop layer 4011 on the stack structure 203, the spacer structure 3011, and exposed portions of the dielectric material layer 202 and/or exposed portions of the substrate 201. The etch stop layer 4011 may be formed of at least one of silicon nitride material, a metal material, and a high-k dielectric material. A first portion (e.g., upper portion) of the etch stop layer 4011 may directly contact both a top side of the mask 243 and a first portion (upper portion) of the spacer structure 3011.

Figure 4:
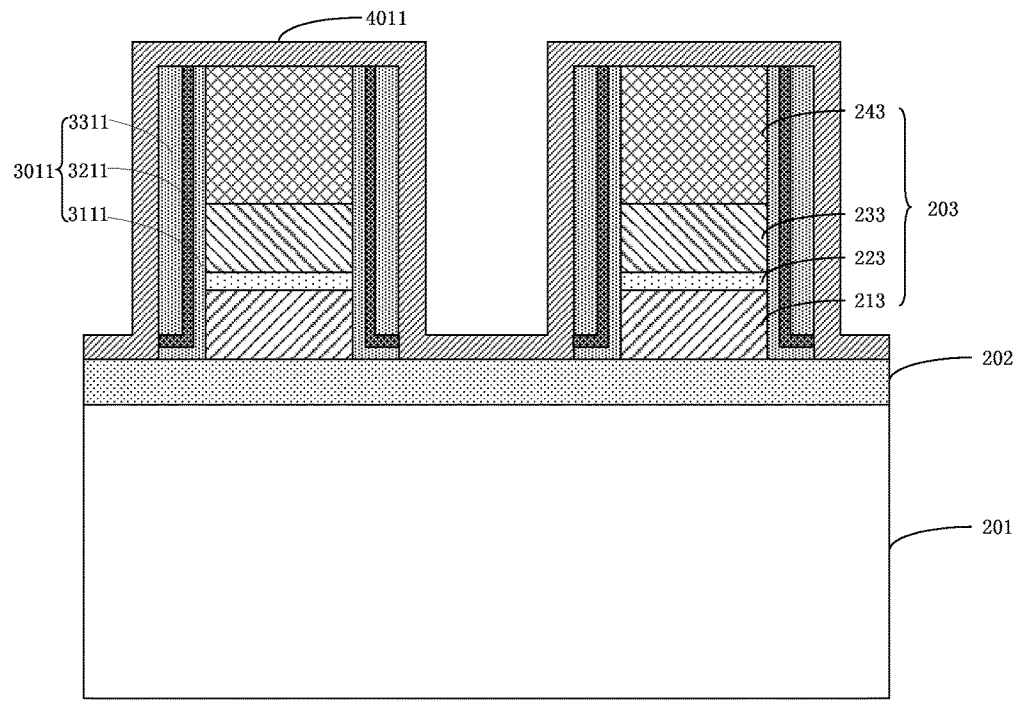
Figure 5:
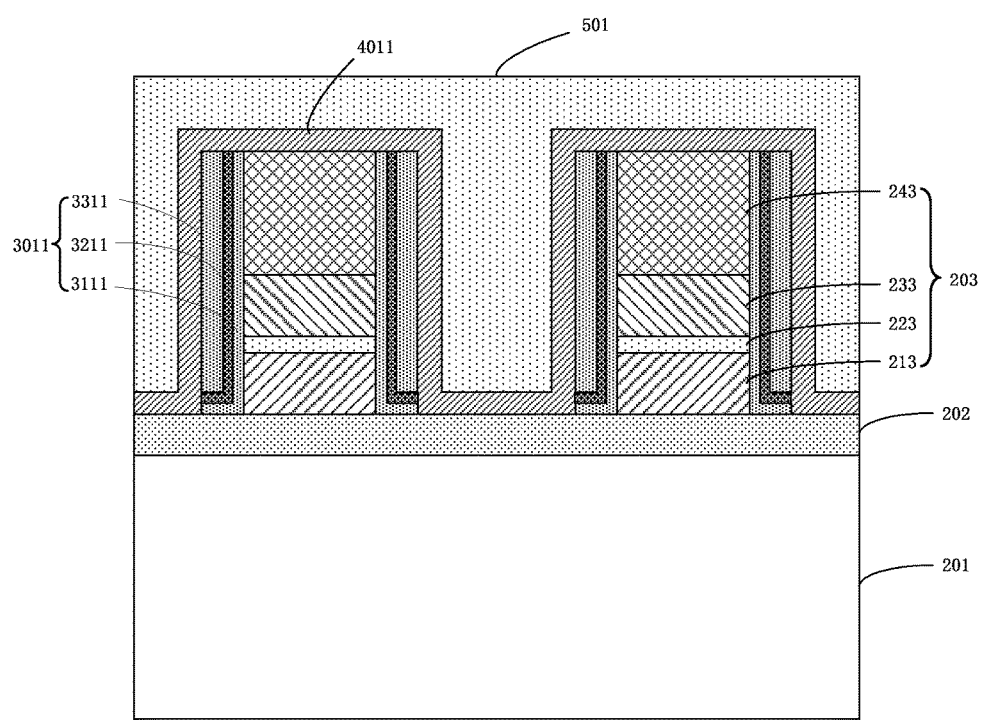

Referring to FIG. 1, FIG. 4, and FIG. 5, subsequent to the step 105, the step 107 may include providing (e.g., using a deposition process) a dielectric material member 501 on the etch stop layer 4011. A material of the dielectric material member 501 may be different from a material of the etch stop layer 4011, such that a subsequent etching process may have substantially high etch selectivity for the dielectric material member 501 over the etch stop layer 4011. The dielectric material member 501 may be formed of a silicon oxide material, while the etch stop layer 4011 may be formed of at least one of silicon nitride material, a metal material, and a high-k dielectric material.

Figure 6:
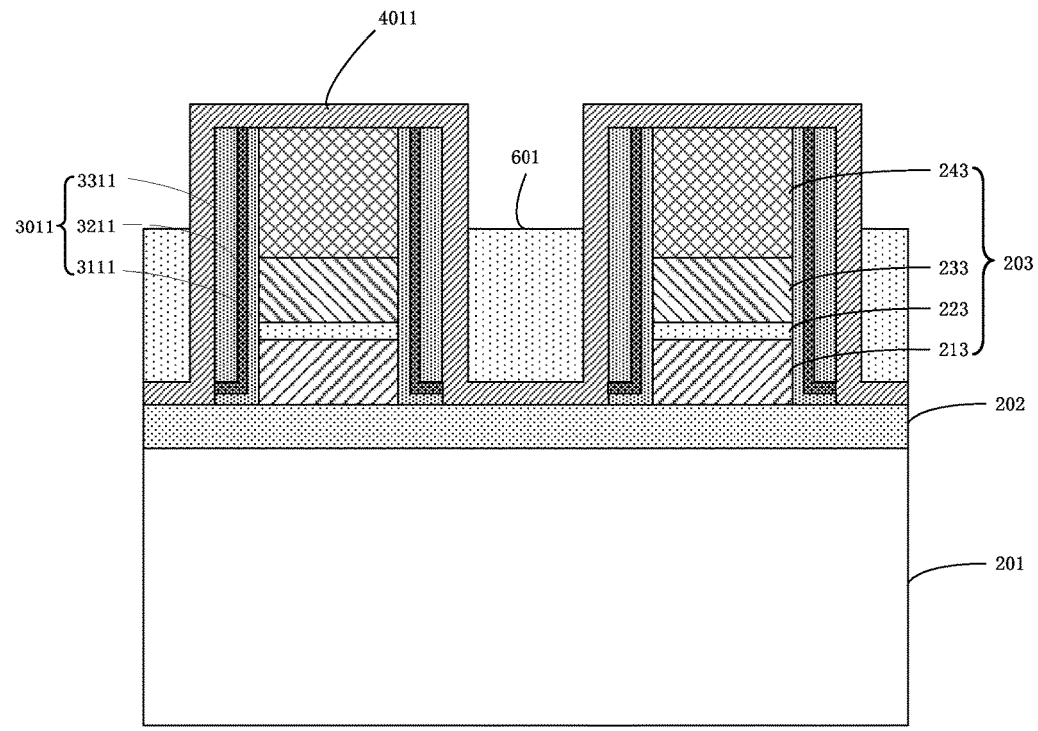

Referring to FIG. 1, FIG. 5, and FIG. 6, subsequent to the step 107, the step 109 may include partially removing (e.g., using a dry etching process and/or a wet etching process) the dielectric material member 501 to form a dielectric member 601 and to expose the first portion (e.g., upper portion) of the etch stop layer 4011.

A difference between a height of the mask 243 and a height of the dielectric member 601 may be in a range of 40% of a thickness of the mask 243 and 85% of the thickness of the mask 243. The height of the mask 243 and the height of the dielectric member 601 may be measured with reference to the bottom side of the substrate 201. The thickness of the mask 243 may be in a direction perpendicular to the bottom side of the substrate 201.

In an embodiment, the thickness of the mask 243 may be about 1800 angstroms, and the difference between the height of the mask 243 and the height of the dielectric member 601 may be in a range of about 800 angstroms to about 1500 angstroms, such as about 800 angstroms, about 1000 angstroms, about 1300 angstroms, or about 1500 angstroms. The height difference may enable a sufficient thickness of a subsequently formed spacer 901 for ensuring integrity of a substantially formed spacer 301 and may enable a sufficient height of the spacer 301.

Figure 7:
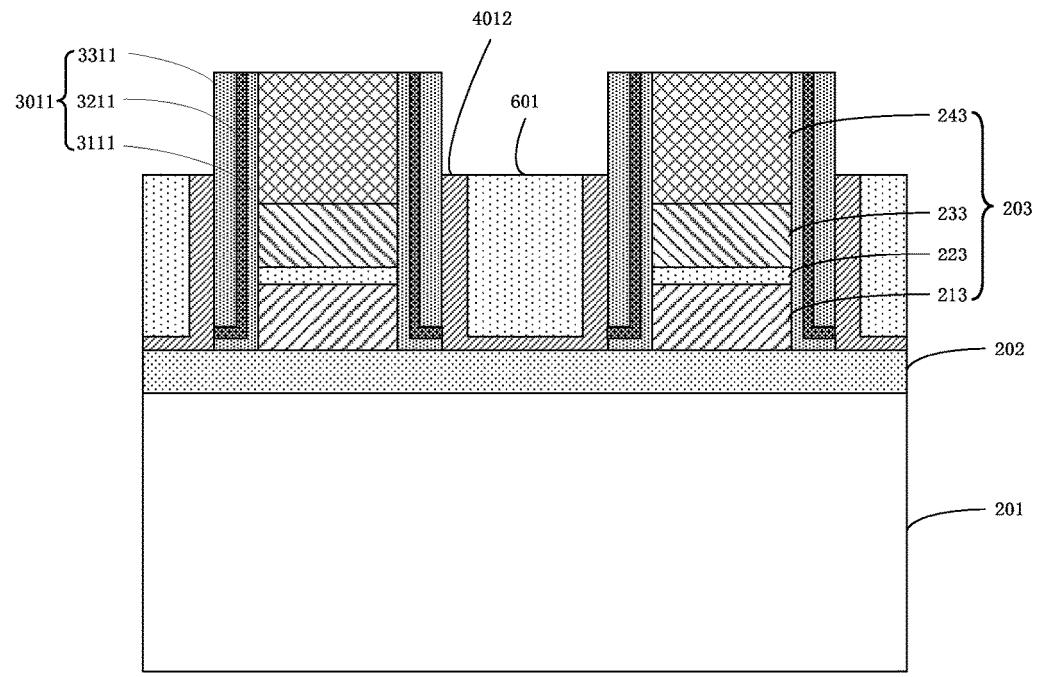

Referring to FIG. 1, FIG. 6, and FIG. 7, subsequent to the step 109, the step 111 may include removing the first portion (e.g., upper portion) of the etch stop layer 4011 to form an etch stop material layer 4012 and to expose the first portion (e.g., upper portion) of the spacer structure 3011. The step 111 may include using a dry etching process, e.g., a remote plasma dry etching process, for removing the first portion (e.g., upper portion) of the etch stop layer 4011. The remote plasma dry etching process may provide relative strong lateral etching and therefore may effectively remove the first portion (e.g., upper portion) of the etch stop layer 4011 without significantly damaging the mask 243. In the remote plasma dry etching process, the etching gas may include at least one of $NF_3$, $NH_3$, and $CF_4$; the power may be in a range of 100 W to 2000 W; and the time duration may be in a range of 10 seconds to 600 seconds.

Figure 8:
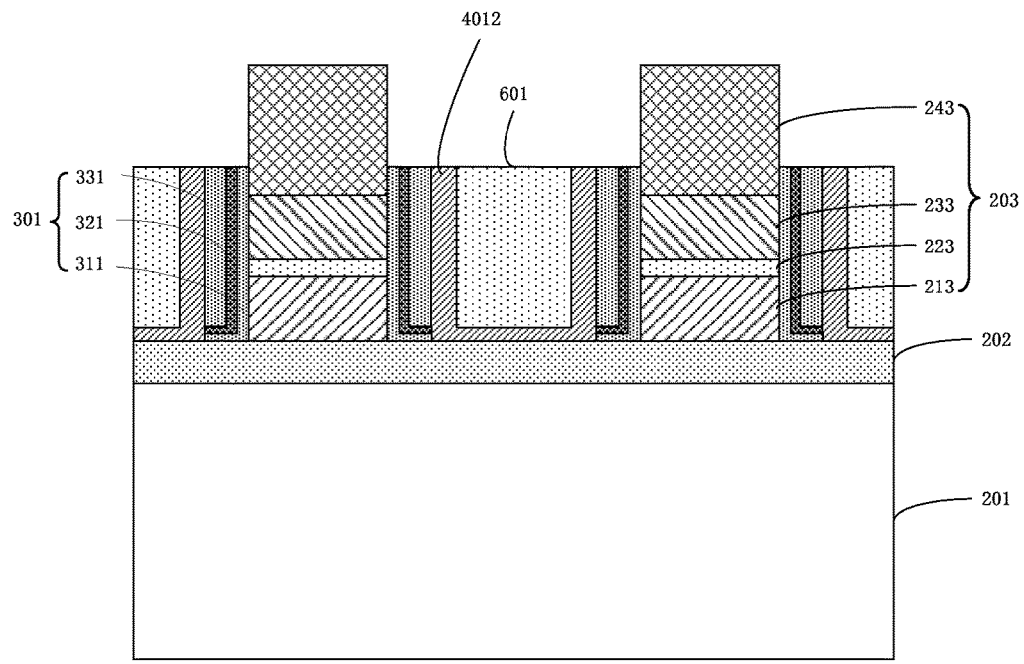

Referring to FIG. 1, FIG. 7, and FIG. 8, subsequent to the step 111, the step 113 may include removing the first portion (e.g., upper portion) of the spacer structure 3011 to form a spacer 301 and to expose a lateral side of the mask 243. The step 113 may include using a dry etching process, e.g., a remote plasma dry etching process, for removing the first portion (e.g., upper portion) of the spacer structure 3011. The remote plasma dry etching process may provide relative strong lateral etching and therefore may effectively remove the first portion (e.g., upper portion) of the spacer structure 3011 without significantly damaging the mask 243. In the remote plasma dry etching process, the etching gas may include at least one of $NF_3$, $NH_3$, and $CF_4$; the power may be in a range of 100 W to 2000 W; and the time duration may be in a range of 10 seconds to 600 seconds.

The spacer 301 may include a silicon oxide layer 311 and a silicon nitride layer 321. The silicon oxide layer 311 may be positioned between the silicon nitride layer 321 and the insulator 223 and may directly contact each of the silicon nitride layer 321 and the insulator 223. The silicon nitride layer 321 may be positioned between the silicon oxide layer 311 and the etch stop material layer 4012. A portion of the silicon oxide layer 311 may be positioned between the silicon nitride layer 321 and the dielectric material layer 202 and may directly contact each of the silicon nitride layer 321, the dielectric material layer 202, and the etch stop material layer 4012.

The spacer 301 may include a silicon oxide layer 331. The silicon oxide layer 331 may be positioned between the silicon nitride layer 321 and the etch stop material layer 4012 and may directly contact each of the silicon nitride layer 321 and the etch stop material layer 4012. The silicon nitride layer 321 may be positioned between the silicon oxide layer 311 and the silicon oxide layer 331. A portion of the silicon nitride layer 321 may be positioned between the silicon oxide layer 331 and the dielectric material layer 202 and may directly contact the etch stop material layer 4012.

Figure 9:
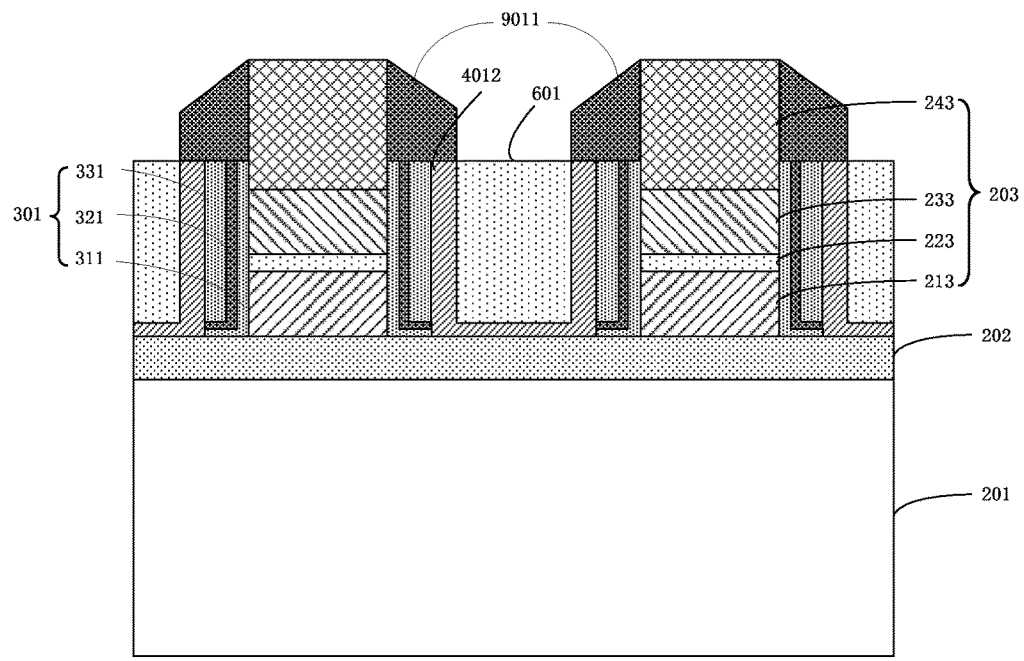

Referring to FIG. 1, FIG. 8, and FIG. 9, subsequent to the step 113, the step 115 may include providing a spacer material member 9011. The spacer material member 9011 may directly contact both a top side of the spacer 301 and the lateral side of the mask 243. The spacer material member 9011 may cover and directly contact each of a top side of the silicon oxide layer 311, a top side of the silicon nitride layer 321, and a top side of the silicon oxide layer 331. The spacer material member 9011 may cover and directly contact a top side of the etch stop material layer 4012.

A material of the spacer material member 9011 may be different from a material of the dielectric member 601, such that a subsequent etching process may have substantially high etch selectivity for the dielectric member 601 over the spacer material member 9011. The spacer material member 9011 may be formed of a silicon nitride material. The method may include subsequently removing, e.g., using the etching process, the dielectric member 601 for forming a contact hole for accommodating a conductive member. The spacer material member 9011 may substantially remain as a result of the etching process.

Figure 10:
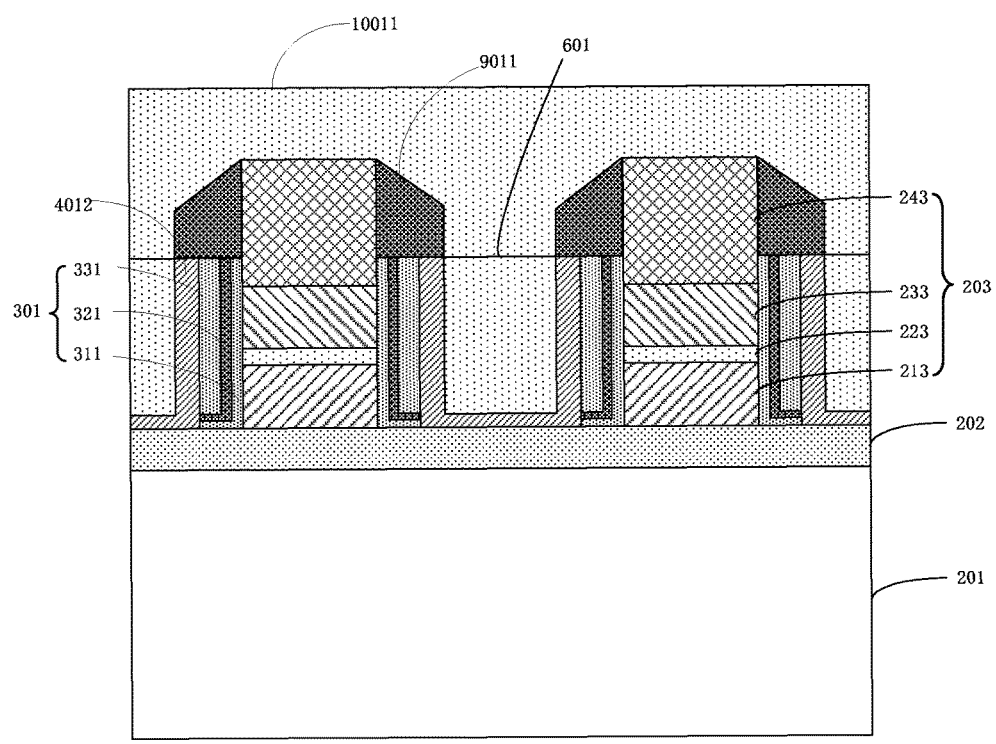

Referring to FIG. 9 and FIG. 10, the method may include providing a dielectric material member 10011 on the dielectric member 601, the spacer material member 9011, and the mask 243. A material of the dielectric material member 10011 may be identical to the material of the dielectric member 601, such as a silicon oxide material.

Figure 11A:
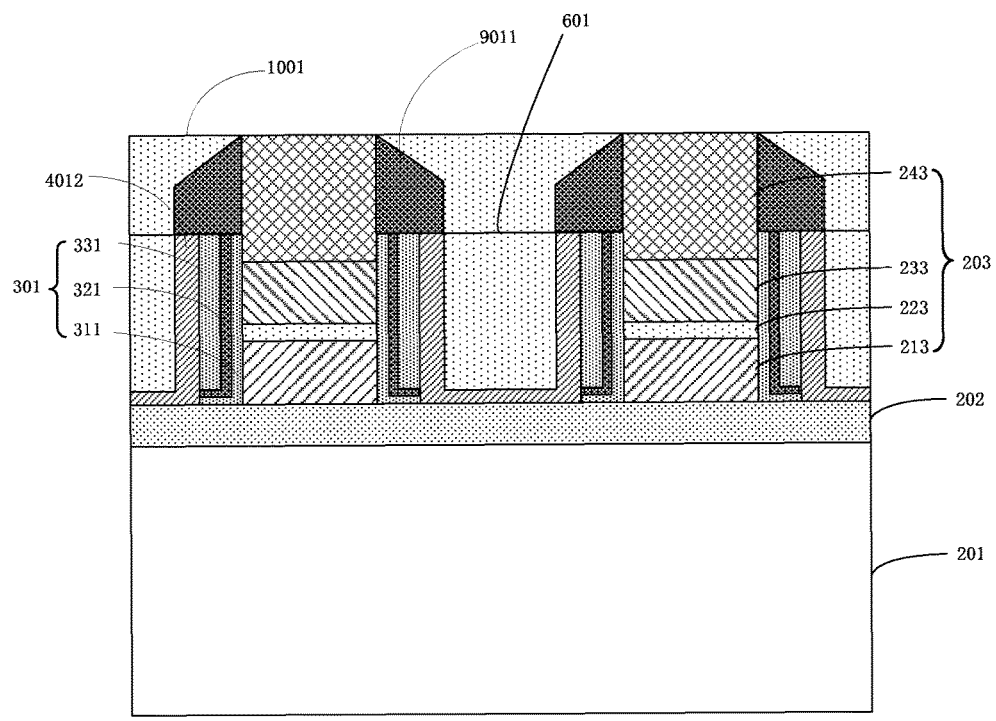
Figure 11B:
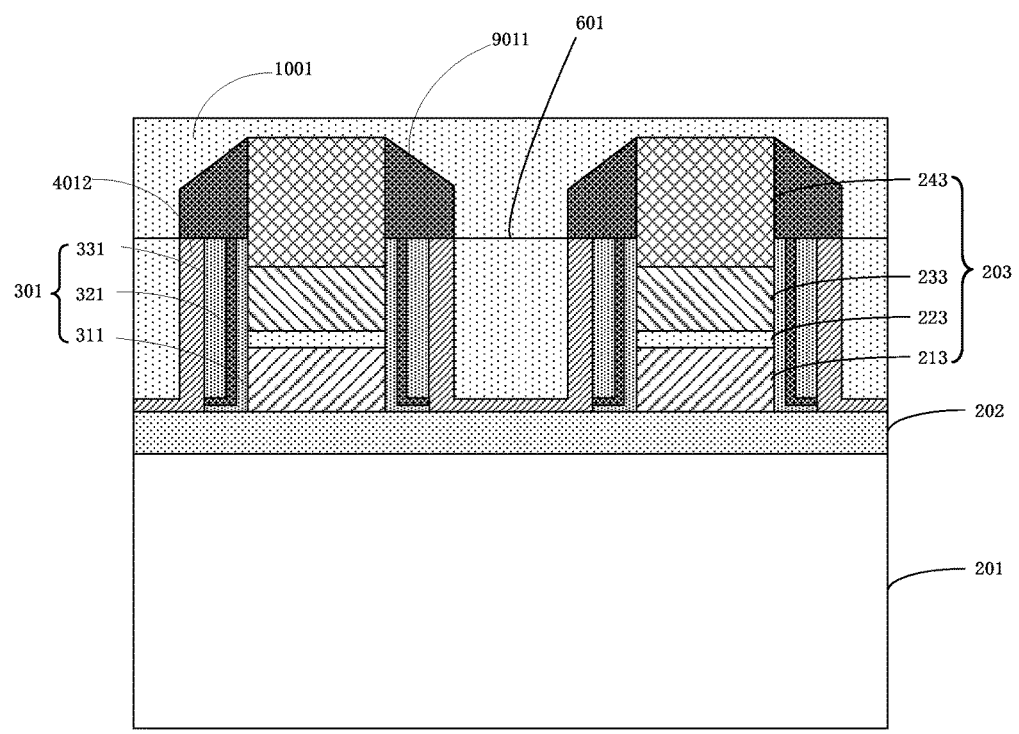

Referring to FIG. 10 and FIG. 11A or FIG. 11B, the method may include partially removing the dielectric material member 10011 using a planarization process (e.g., a chemical-mechanical planarization process) to form a dielectric member 1001. Referring to FIG. 11A, the mask 243 may be exposed as a result of the planarization process. Referring to FIG. 11B, the mask 243 may remain covered as a result of the planarization process.

Figure 12:
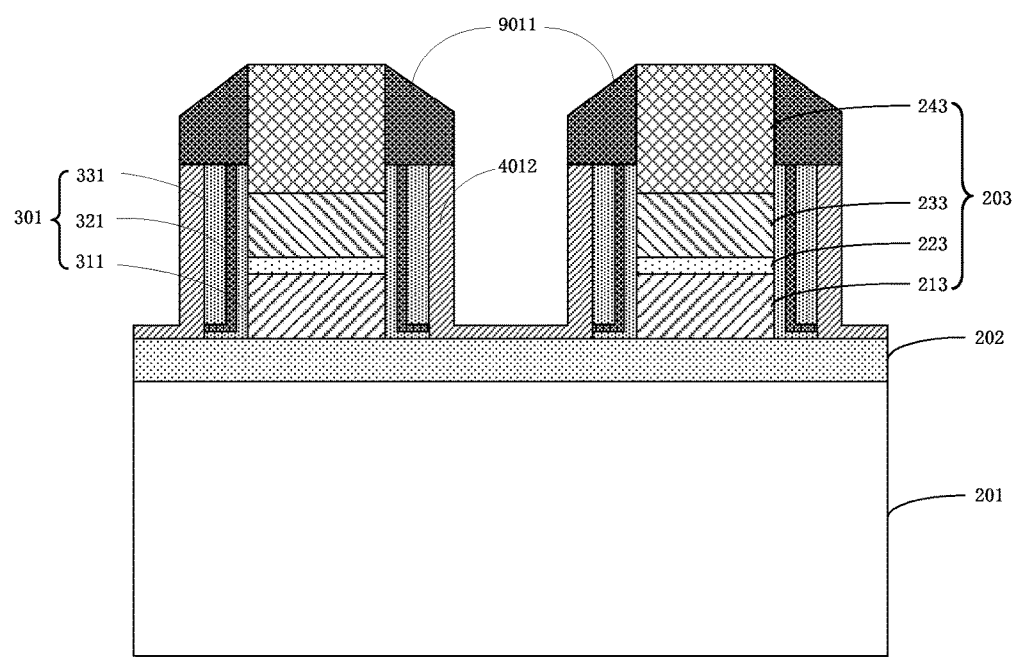

Referring to FIG. 11A or FIG. 11B and FIG. 12, the method may include removing (e.g., using a wet etching process and/or a dry etching process) the dielectric member 1001 and the dielectric member 601 to expose the etch stop material layer 4012.

Figure 13:
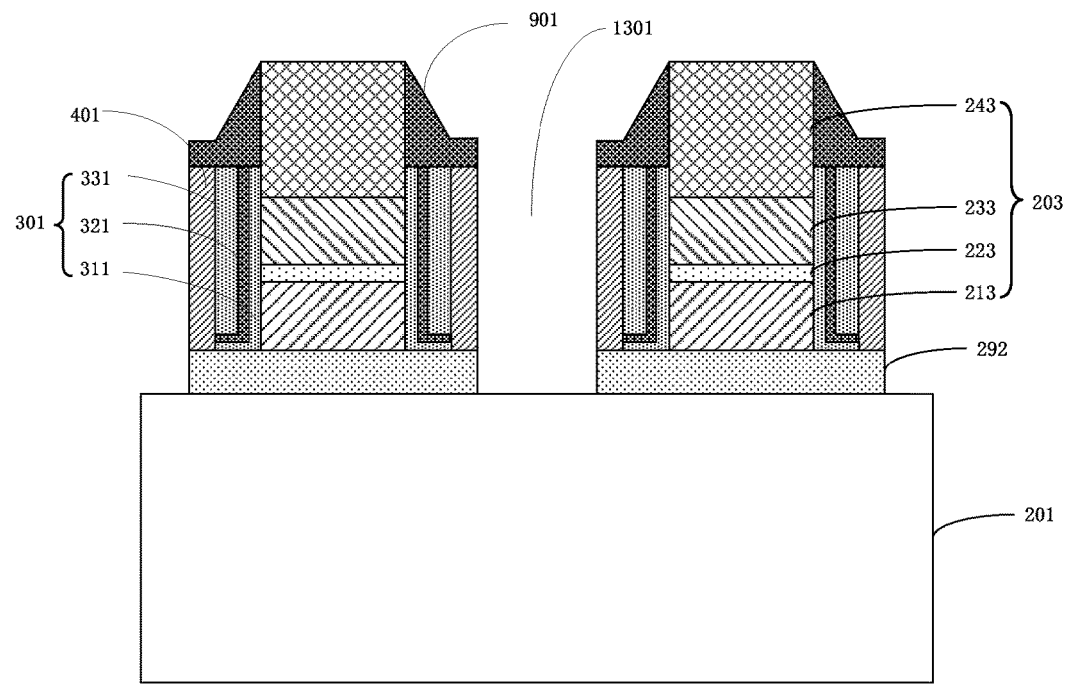

Referring to FIG. 12 and FIG. 13, the method may include partially removing the etch stop material layer 4012 to form an etch stop material member 401. A portion of the etch stop material layer 4012 that directly contacts a portion of the dielectric material layer 202 may be removed, such that the portion of the dielectric material layer 202 may be exposed. The etch stop material member 401 may directly contact the spacer 301. The method may further include partially removing the dielectric material layer 202 (by removing the exposed portion of the dielectric material layer 202) to form a dielectric layer 292 and to form a hole 1301 that exposes a portion of the substrate 201. The portion of the substrate 201 may function as an active region, such as a source region or a drain region, of the semiconductor device.

Referring to FIG. 12 and FIG. 13, the method may include partially removing the spacer material member 9011 to form a spacer 901 in a process of performing at least one of exposing the etch stop material layer 4012, forming the etch stop material member 401, and forming the hole 1301.

Figure 14:
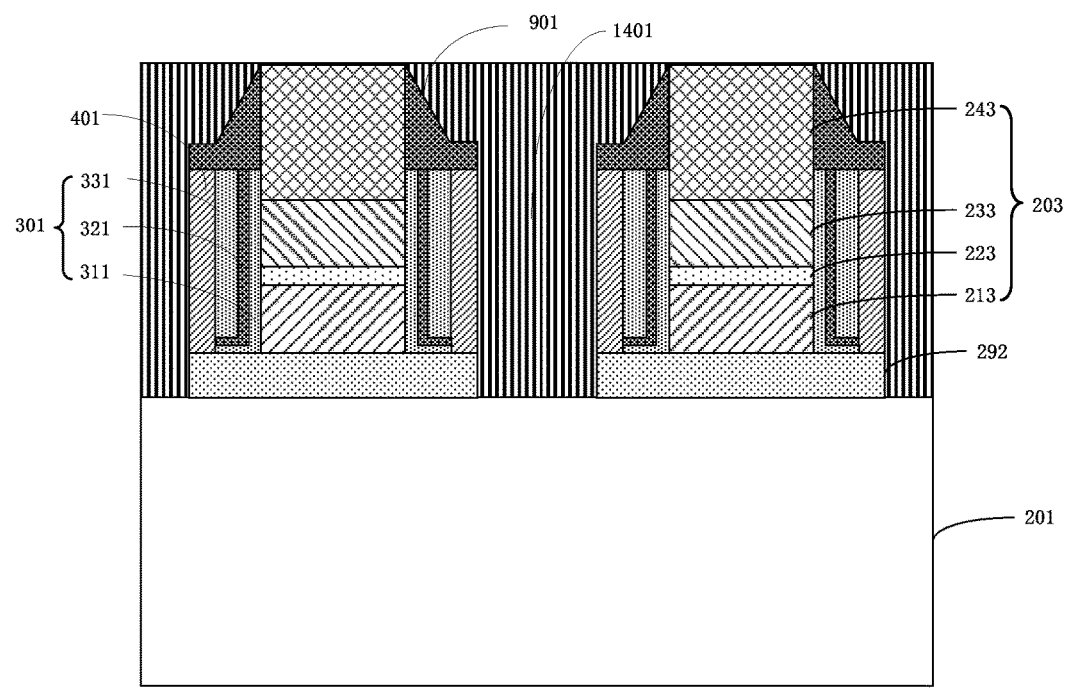

Referring to FIG. 13 and FIG. 14, the method may include providing a conductive member 1401 in the hole 1301. The conductive member 1401 may directly contact each of the substrate 201, the dielectric layer 292, the etch stop material member 401, and the spacer 901.

FIG. 14 shows a schematic diagram (e.g., a schematic cross-sectional view) that illustrates elements and/or structures in a semiconductor device, such as a flash memory device (e.g., a NOR flash), in accordance with one or more embodiments. The semiconductor device may include a substrate 201.

The semiconductor device may further include a stack structure 203 (e.g., a gate stack structure), which may include a conductor 213 (e.g., a floating gate electrode), an insulator 223, a conductor 233 (e.g., a control gate electrode), and a mask 243. The insulator 223 and the conductor 233 may be positioned between the conductor 213 and the mask 243.

The semiconductor device may further include a dielectric layer 292 positioned between the substrate 201 and the stack structure 203.

The semiconductor device may further include a spacer 301, which may directly contact the dielectric layer 292 and may directly contact a first portion (e.g., lower portion) of a first side (e.g., lateral side) of the stack structure 203. The spacer 301 may directly contact each of the conductor 213, the insulator 223, the conductor 233, and the mask 243.

The semiconductor device may further include a spacer 901, which may directly contact the spacer 301 and may directly contact a second portion (e.g., upper portion) of the first side (e.g., lateral side) of the stack structure 203. The spacer 901 may directly contact the mask 243. The spacer 301 may be positioned between the spacer 901 and the dielectric layer 292.

The semiconductor device may further include an etch stop material member 401, which may directly contact each of the dielectric layer 292, the spacer 301, and the spacer 901 and may be positioned between the dielectric layer 292 and the spacer 901. A material of the etch stop material member 401 may be different from a material of the spacer 901. The etch stop material member 401 may be formed of at least one of silicon nitride material, a metal material, and a high-k dielectric material.

The semiconductor device may further include a conductive member 1401, which may directly contact each of the spacer 901, the etch stop material member 401, the dielectric layer 292, and the substrate 201.

The spacer 301 may include a silicon oxide layer 311 and a silicon nitride layer 321. The silicon oxide layer 311 may be positioned between the silicon nitride layer 321 and the insulator 223 and may directly contact each of the silicon nitride layer 321 and the insulator 223. The silicon nitride layer 321 may be positioned between the silicon oxide layer 311 and the etch stop material layer 4012. The spacer material member 9011 may directly contact each of the silicon oxide layer 311 and the silicon nitride layer 321. A portion of the silicon oxide layer 311 may be positioned between the silicon nitride layer 321 and the dielectric material layer 202 and may directly contact each of the silicon nitride layer 321, the dielectric material layer 202, and the etch stop material layer 4012.

The spacer 301 may include a silicon oxide layer 331. The silicon oxide layer 331 may be positioned between the silicon nitride layer 321 and the etch stop material layer 4012 and may directly contact each of the silicon nitride layer 321 and the etch stop material layer 4012. The silicon nitride layer 321 may be positioned between the silicon oxide layer 311 and the second silicon oxide layer. The spacer material member 9011 may directly contact the silicon oxide layer 331. A portion of the silicon nitride layer 321 may be positioned between the silicon oxide layer 331 and the dielectric material layer 202 and may directly contact the etch stop material layer 4012.

According to embodiments, in manufacturing of the semiconductor device, spacers provided on a gate structure may be sufficiently protected without being significantly damaged. Therefore, the gate structure may be desirably spaced from other elements of the semiconductor device, such that a threshold voltage of the semiconductor may remain sufficiently stable. Advantageously, satisfactory performance of the semiconductor device may be substantially maintained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a semiconductor device, the method comprising:
    preparing a substrate, a dielectric material layer, and a stack structure, wherein the dielectric material layer is positioned between the substrate and the stack structure, wherein the stack structure comprises a first conductor, an insulator, a second conductor, and a mask, wherein the first conductor, the insulator, and the second conductor are positioned between the dielectric material layer and the mask;
    providing a spacer structure on a first side of the stack structure, wherein the first side of the stack structure is not parallel to a bottom side of the substrate;
    providing an etch stop layer, wherein a first portion of the etch stop layer directly contacts both the mask and a first portion of the spacer structure;
    providing a first dielectric material member on the etch stop layer, wherein a material of the first dielectric material member is different from a material of the etch stop layer;
    partially removing the first dielectric material member to form a first dielectric member and to expose the first portion of the etch stop layer;
    removing the first portion of the etch stop layer to form an etch stop material layer and to expose the first portion of the spacer structure;
    removing the first portion of the spacer structure to form a first spacer and to expose a first side of the mask; and
    providing a spacer material member, wherein the spacer material member directly contacts both the first spacer and the first side of the mask, and wherein a material of the spacer material member is different from a material of the first dielectric member.

2. The method of claim 1 comprising:
    using a remote plasma dry etching process to remove at least one of the first portion of the etch stop layer and the first portion of the spacer structure.

3. The method of claim 1 comprising:
    removing the first dielectric member to expose the etch stop material layer;
    partially removing the etch stop material layer to form an etch stop material member, wherein the etch stop material member directly contacts the first spacer; and
    partially removing the dielectric material layer to form a dielectric layer and to form a hole that exposes a portion of the substrate.

4. The method of claim 3 comprising:
    partially removing the spacer material member to form a second spacer in a process of performing at least one of exposing the etch stop material layer, forming the etch stop material member, and forming the hole.

5. The method of claim 3 comprising:
    providing a second dielectric material member on the first dielectric member, the spacer material member, and the mask;
    partially removing the second dielectric material member using a planarization process to form a second dielectric member; and
    removing the second dielectric member and the first dielectric member to expose the etch stop material layer.

6. The method of claim 5 comprising:
    partially removing the spacer material member to form a second spacer in a process of performing at least one of exposing the etch stop material layer, forming the etch stop material member, and forming the hole.

7. The method of claim 6 comprising:
    providing a conductive member in the hole, wherein the conductive member directly contacts each of the substrate, the dielectric layer, the etch stop material member, and the second spacer.

8. The method of claim 3 comprising:
    providing a conductive member in the hole, wherein the conductive member directly contacts each of the substrate, the dielectric layer, the etch stop material member, and the spacer material member.

9. The method of claim 1,
    wherein the first spacer comprises a first silicon oxide layer and a silicon nitride layer,
    wherein the first silicon oxide layer is positioned between the silicon nitride layer and the insulator and directly contacts each of the silicon nitride layer and the insulator,
    wherein the silicon nitride layer is positioned between the first silicon oxide layer and the etch stop material layer, and
    wherein the spacer material member directly contacts each of the first silicon oxide layer and the silicon nitride layer.

10. The method of claim 9, wherein a portion of the first silicon oxide layer is positioned between the silicon nitride layer and the dielectric material layer and directly contacts each of the silicon nitride layer, the dielectric material layer, and the etch stop material layer.

11. The method of claim 9,
    wherein the first spacer comprises a second silicon oxide layer,
    wherein the second silicon oxide layer is positioned between the silicon nitride layer and the etch stop material layer and directly contacts each of the silicon nitride layer and the etch stop material layer,
    wherein the silicon nitride layer is positioned between the first silicon oxide layer and the second silicon oxide layer, and
    wherein the spacer material member directly contacts the second silicon oxide layer.

12. The method of claim 11, wherein a portion of the silicon nitride layer is positioned between the second silicon oxide layer and the dielectric material layer and directly contacts the etch stop material layer.

13. The method of claim 1,
    wherein a difference between a height of the mask and a height of the first dielectric member is in a range of 40% of a thickness of the mask and 85% of the thickness of the mask,
    wherein the height of the mask and the height of the first dielectric member are with reference to the bottom side of the substrate, and
    wherein the thickness of the mask is in a direction perpendicular to the bottom side of the substrate.

14. The method of claim 1, wherein the etch stop layer is formed of at least one of silicon nitride material, a metal material, and a high-k dielectric material.

15. The method of claim 1, wherein the etch stop layer directly contacts the spacer material member and at least two dielectric layers of the spacer structure.

16. A semiconductor device comprising:
    a substrate;
    a stack structure, which comprises a first conductor, an insulator, a second conductor, and a mask, wherein the insulator and the second conductor are positioned between the first conductor and the mask;

a dielectric layer positioned between the substrate and the stack structure;

a first spacer, which directly contacts the dielectric layer and directly contacts a first portion of a first side of the stack structure;

a second spacer, which directly contacts the first spacer and directly contacts a second portion of the first side of the stack structure, wherein the first spacer is positioned between the second spacer and the dielectric layer; and an etch stop material member, which directly contacts each of the dielectric layer, the first spacer, and the second spacer and is positioned between the dielectric layer and the second spacer, wherein a material of the etch stop material member is different from a material of the second spacer.

17. The semiconductor device of claim 16, wherein the first spacer directly contacts each of the first conductor, the insulator, the second conductor, and the mask, and wherein the second spacer directly contacts the mask.

18. The semiconductor device of claim 16 comprising: a conductive member, which directly contacts each of the second spacer, the etch stop material member, the dielectric layer, and the substrate.

19. The semiconductor device of claim 16, wherein the etch stop material member is formed of at least one of silicon nitride material, a metal material, and a high-k dielectric material.

20. The semiconductor device of claim 16, wherein the first spacer comprises a first silicon oxide layer and a silicon nitride layer, wherein the first silicon oxide layer is positioned between the silicon nitride layer and the insulator and directly contacts each of the silicon nitride layer and the insulator, wherein the silicon nitride layer is positioned between the first silicon oxide layer and the etch stop material layer, wherein the spacer material member directly contacts each of the first silicon oxide layer and the silicon nitride layer, and wherein a portion of the first silicon oxide layer is positioned between the silicon nitride layer and the dielectric material layer and directly contacts each of the silicon nitride layer, the dielectric material layer, and the etch stop material layer.

* * * * *